United States Patent
Sakalabhaktula et al.

(10) Patent No.: US 12,249,996 B2
(45) Date of Patent: Mar. 11, 2025

(54) COUNTER DESIGN FOR A TIME-TO-DIGITAL CONVERTER (TDC)

(71) Applicant: Shaoxing Yuanfang Semiconductor Co., Ltd., Shaoxin (CN)

(72) Inventors: Manikanta Sakalabhaktula, Bangalore (IN); Debasish Behera, Bangalore (IN); Raja Prabhu J, Bangalore (IN); Girisha Angadi Basavaraja, Bangalore (IN); Nandakishore Palla, Bangalore (IN); Chandrasekhar BG, Bangalore (IN); Sudarshan Varadarajan, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 412 days.

(21) Appl. No.: 17/662,662

(22) Filed: May 10, 2022

(65) Prior Publication Data

US 2023/0106659 A1    Apr. 6, 2023

(30) Foreign Application Priority Data

Sep. 30, 2021   (IN) .............. 202141044473

(51) Int. Cl.
*H03L 7/085* (2006.01)
*G04F 10/00* (2006.01)
*H03L 7/081* (2006.01)

(52) U.S. Cl.
CPC ............ *H03L 7/085* (2013.01); *G04F 10/005* (2013.01); *H03L 7/081* (2013.01)

(58) Field of Classification Search
CPC ........ G04F 10/005; H03L 7/081; H03L 7/085
See application file for complete search history.

(56) References Cited

U.S. PATENT DOCUMENTS

| | | | |
|---|---|---|---|
| 7,071,751 B1 | 7/2006 | Kaviani | |
| 9,092,013 B2 * | 7/2015 | Song | ..................... G04F 10/005 |
| 9,188,961 B1 * | 11/2015 | Liu | ........................... H03M 1/50 |
| 9,405,024 B2 | 8/2016 | Frach et al. | |
| 9,864,341 B1 * | 1/2018 | Zhuang | ................. G04F 10/005 |
| 10,496,041 B2 | 12/2019 | Yao et al. | |

(Continued)

FOREIGN PATENT DOCUMENTS

| | | | | |
|---|---|---|---|---|
| CN | 114675526 A | * | 6/2022 | ........... G04F 10/005 |
| EP | 4099052 A1 | * | 12/2022 | ........... G01S 17/894 |

(Continued)

OTHER PUBLICATIONS

M. Skandar Basrour et al., " Time-to-Digital Conversion based on a Self-Timed Ring Oscillator" Nov. 20, 2019, 145 pages.

(Continued)

*Primary Examiner* — Adam D Houston
(74) *Attorney, Agent, or Firm* — IPHORIZONS PLLC; Narendra Reddy Thappeta

(57) ABSTRACT

A time-to-digital converter (TDC) includes a counter and a digital core. The counter is designed to generate a sequence of counts representing a number of transitions of interest of a first clock signal. The counter includes an asynchronous circuit and a synchronous circuit to respectively generate a first set of bits and a second set of bits of each of the sequence of numbers. The digital core is designed to process a pair of counts of the sequence.

20 Claims, 12 Drawing Sheets

(56) References Cited

U.S. PATENT DOCUMENTS

| | | | | |
|---|---|---|---|---|
| 10,505,554 | B2* | 12/2019 | Janardhanan | H03L 7/091 |
| 10,567,154 | B1* | 2/2020 | Wentzloff | H03L 7/0995 |
| 10,671,025 | B2 | 6/2020 | Mautner et al. | |
| 10,819,355 | B1* | 10/2020 | Abughazaleh | H03L 7/0992 |
| 10,868,541 | B1 | 12/2020 | Choi et al. | |
| 11,067,954 | B1* | 7/2021 | Bhaumik | H03L 7/085 |
| 11,079,723 | B2* | 8/2021 | Chu | H03K 21/38 |
| 11,108,400 | B1* | 8/2021 | Armstrong | H03L 7/1976 |
| 11,320,792 | B2* | 5/2022 | Sudo | G04F 10/005 |
| 11,387,834 | B1* | 7/2022 | Kumar | H03L 7/1803 |
| 11,418,204 | B2* | 8/2022 | Gupta | H03L 7/093 |
| 11,588,489 | B1* | 2/2023 | Gupta | H03L 7/0992 |
| 11,592,786 | B1* | 2/2023 | Behera | H03L 7/0992 |
| 11,677,404 | B1* | 6/2023 | Harush | H03L 7/093 327/159 |
| 11,736,110 | B2* | 8/2023 | Palla | H03L 7/081 327/156 |
| 11,774,915 | B2* | 10/2023 | Abdulaziz | H03L 7/087 327/159 |
| 2003/0098731 | A1* | 5/2003 | Tabatabaei | G04F 10/06 327/160 |
| 2004/0161068 | A1* | 8/2004 | Zerbe et al. | H03L 7/087 375/355 |
| 2008/0069292 | A1 | 3/2008 | Straayer et al. | |
| 2009/0296532 | A1* | 12/2009 | Hsieh | G04F 10/005 368/120 |
| 2010/0023289 | A1* | 1/2010 | Miyazaki | G01R 29/023 702/69 |
| 2010/0134083 | A1* | 6/2010 | Trescases | H03M 1/1014 323/283 |
| 2010/0327912 | A1* | 12/2010 | Chiu | H03L 7/0802 327/159 |
| 2016/0371363 | A1* | 12/2016 | Muro | G06Q 10/10 |
| 2017/0205772 | A1* | 7/2017 | Burg | H03L 7/18 |
| 2019/0280649 | A1* | 9/2019 | Janardhanan | H03L 7/085 |
| 2019/0339650 | A1* | 11/2019 | Yao | G04F 10/005 |
| 2019/0339651 | A1* | 11/2019 | Yao | H03L 7/085 |
| 2019/0348989 | A1* | 11/2019 | Janardhanan | G04F 10/005 |
| 2020/0028662 | A1* | 1/2020 | Brown | H03L 7/18 |
| 2020/0192301 | A1* | 6/2020 | Khoury | H03L 7/085 |
| 2021/0302550 | A1* | 9/2021 | Dutton | G01S 17/10 |
| 2021/0344348 | A1* | 11/2021 | Bhaumik | H03L 7/0995 |
| 2022/0026856 | A1* | 1/2022 | Lee | H03L 7/085 |
| 2022/0278690 | A1* | 9/2022 | Shumaker | G04F 10/005 |
| 2023/0006683 | A1* | 1/2023 | J | H03L 7/0992 |
| 2023/0106659 | A1* | 4/2023 | Sakalabhaktula | H03L 7/081 327/158 |
| 2023/0108841 | A1* | 4/2023 | Palla | G04F 10/005 327/156 |
| 2023/0122081 | A1* | 4/2023 | Sridharan | H03L 7/087 327/156 |
| 2023/0128789 | A1* | 4/2023 | J | G06F 1/26 |
| 2024/0036525 | A1* | 2/2024 | Al-Maharmeh | G06F 9/54 |

FOREIGN PATENT DOCUMENTS

| | | | | |
|---|---|---|---|---|
| KR | 20230036978 A | * | 3/2023 | |
| WO | WO-2019190547 A1 | * | 10/2019 | G04F 10/005 |
| WO | WO-2020135332 A1 | * | 7/2020 | H04J 3/0685 |
| WO | WO-2021185430 A1 | * | 9/2021 | G04F 10/005 |
| WO | WO-2021254606 A1 | * | 12/2021 | G04F 10/005 |
| WO | WO-2022128049 A1 | * | 6/2022 | H03L 7/087 |
| WO | WO-2023038417 A1 | * | 3/2023 | G01S 17/89 |

OTHER PUBLICATIONS

"Variable Modulus Counter" http://www.elektronikjk.pl/elementy_czynne/IC/9305.pdf, downloaded circa Jan. 10, 2022, 04 Pages.

Wu Gao et al., "Integrated High-Resolution Multi-Channel Time-to-Digital Converters (TDCs) for PET Imaging" , http://citeseerx.ist.psu.edu/viewdoc/download?doi=10.1.1.688.658&rep=rep1&type=pdf, Jan. 8, 2011, 23 Pages.

Kuo-Hsing Cheng et al., "A time-to-digital converter using multi-phase-sampling and time amplifier for all digital phase-locked loop," 13th IEEE Symposium on Design and Diagnostics of Electronic Circuits and Systems, Date of Conference: Apr. 14-16, 2010, 05 Pages.

Scott Tancock et al., "A Review of New Time-to-Digital Conversion Techniques," in IEEE Transactions on Instrumentation and Measurement, vol. 68, No. 10, pp. 3406-3417, Oct. 2019.

Kyu-Dong Hwang et al., "An area efficient asynchronous gated ring oscillator TDC with minimum GRO stages," Proceedings of 2010 IEEE International Symposium on Circuits and Systems, Date of Conference: May 30, 2010-Jun. 2, 2010, pp. 3973-3976.

"TDC7201 Time-to-Digital Converter for Time-of-Flight Applications in LIDAR, Range Finders, and ADAS" SNAS686—May 2016 DOI: https://www.ti.com/lit/ds/symlink/tdc7201.pdf?ts=1641356653664&ref_url=https%253A%252F%252Fwww.google.com%252F, May 2016, 50 Pages.

"Time-to-Digital Converter with Analog Front-End" MAX35101 DOI: https://datasheets.maximintegrated.com/en/ds/MAX35101.pdf, Downloaded circa Jan. 10, 2022, 66 Pages.

J. Christiansen, "High Performance Time to Digital Converter" Version 2.2, https://cds.cern.ch/record/1067476/files/cer-002723234.pdf, Mar. 2004, 102 Pages.

"MTD135 8-Channel, Multi-hit Time-to-Digital Converter" , https://teledynelecroy.com/lrs/dsheets/mtd.htm, downloaded circa Jan. 7, 2022, 10 Pages.

"TDC-GP1 General Purpose TDC" General Purpose TDC, Dec. 2, 2001, acam mess electronic, https://www.pmt-fl.com/uploads/2017/09/precision-measurement-db-gp1-en-1019306.pdf, Feb. 12, 2001, 61 Pages.

QuTag, https://www.qutools.com/wp-content/uploads/2019/02/quTAG_Datasheet.pdf, Downloaded circa Jan. 7, 2022, 04 Pages.

* cited by examiner

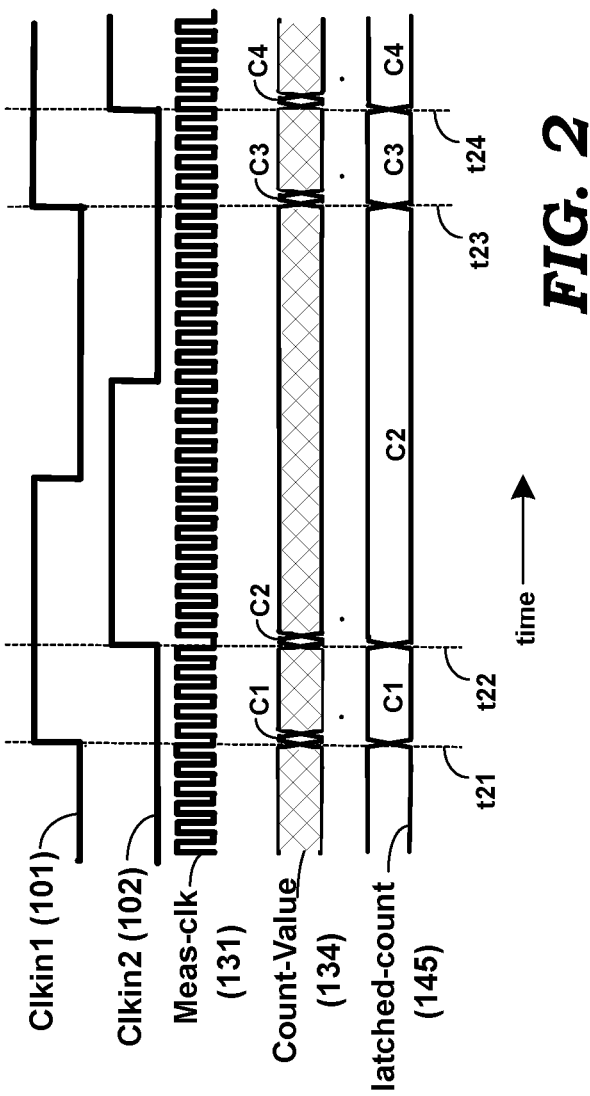

| Latched Five-bit Sync counter value (666 or 667) | | | | | Decimal equivalent | Scount[4] Posedge 1 Negedge 0 | Encoded value |
|---|---|---|---|---|---|---|---|
| Smux[4] | Smux[3] | Smux[2] | Smux[1] | Smux[0] | | | |
| 0 | 0 | 0 | 0 | 0 | 0 | 1 | 24 |
| 0 | 0 | 0 | 0 | 1 | 1 | 1 | 25 |
| 0 | 0 | 0 | 1 | 0 | 2 | 1 | 26 |
| 0 | 0 | 0 | 1 | 1 | 3 | 1 | 27 |
| 0 | 0 | 1 | 0 | 0 | 4 | 1 | 28 |
| 0 | 0 | 1 | 0 | 1 | 5 | 1 | 29 |
| 0 | 0 | 1 | 1 | 0 | 6 | 1 | 30 |
| 0 | 0 | 1 | 1 | 1 | 7 | 1 | 31 |
| 0 | 1 | 0 | 0 | 0 | 8 | 0 | 0 |
| 0 | 1 | 0 | 0 | 1 | 9 | 0 | 1 |
| 0 | 1 | 0 | 1 | 0 | 10 | 0 | 2 |
| 0 | 1 | 0 | 1 | 1 | 11 | 0 | 3 |
| 0 | 1 | 1 | 0 | 0 | 12 | 0 | 4 |
| 0 | 1 | 1 | 0 | 1 | 13 | 0 | 5 |
| 0 | 1 | 1 | 1 | 0 | 14 | 0 | 6 |
| 0 | 1 | 1 | 1 | 1 | 15 | 0 | 7 |
| 1 | 0 | 0 | 0 | 0 | 16 | 0 | 8 |
| 1 | 0 | 0 | 0 | 1 | 17 | 0 | 9 |
| 1 | 0 | 0 | 1 | 0 | 18 | 0 | 10 |
| 1 | 0 | 0 | 1 | 1 | 19 | 0 | 11 |
| 1 | 0 | 1 | 0 | 0 | 20 | 0 | 12 |
| 1 | 0 | 1 | 0 | 1 | 21 | 0 | 13 |
| 1 | 0 | 1 | 1 | 0 | 22 | 0 | 14 |
| 1 | 0 | 1 | 1 | 1 | 23 | 0 | 15 |
| 1 | 1 | 0 | 0 | 0 | 24 | 1 | 16 |
| 1 | 1 | 0 | 0 | 1 | 25 | 1 | 17 |
| 1 | 1 | 0 | 1 | 0 | 26 | 1 | 18 |
| 1 | 1 | 0 | 1 | 1 | 27 | 1 | 19 |
| 1 | 1 | 1 | 0 | 0 | 28 | 1 | 20 |
| 1 | 1 | 1 | 0 | 1 | 29 | 1 | 21 |
| 1 | 1 | 1 | 1 | 0 | 30 | 1 | 22 |
| 1 | 1 | 1 | 1 | 1 | 31 | 1 | 23 |

COUNTER DESIGN FOR A TIME-TO-DIGITAL CONVERTER (TDC)

RELATED APPLICATIONS

The present patent application is related to co-pending U.S. patent application Ser. No. 17/662,667, now granted as U.S. Pat. No. 11,592,786, issued feb. 28, 2023, Entitled, "Time-To-Digital Converter (TDC) Measuring Phase Difference Between Periodic Inputs", inventors Debasish Behera, et al, Filed: May 10, 2022.

The present patent application is related to co-pending U.S. patent application Ser. No. 17/662,669, now granted as U.S. Pat. No. 11,736,110, issued Aug. 22, 2023, Entitled, "Time-to-digital Converter (TDC) Measuring Phase difference between Periodic Inputs with Jitter", inventors Debasish Behera, et al, Filed: May 10, 2022.

PRIORITY CLAIM

The present patent application is related to and claims the benefit of priority to the co-pending India provisional patent application entitled, "Time-to-Digital Converter (TDC) Architecture for Measuring Phase Differences Among Multiple Clocks", Serial No.: 202141044473, Filed: 30 Sep. 2021, which is incorporated in its entirety herewith to the extent not inconsistent with the description herein.

BACKGROUND

Technical Field

Embodiments of the present disclosure relate generally to time-to-digital converters (TDCs), and more specifically to counter design for a TDC.

Related Art

TDCs are generally used to measure a time interval between a pair of events and convert the time interval into a digital value. The events are typically voltage or logic-level changes of a corresponding pair of input signals. TDCs find applications in electronic devices such as phase locked loops (PLL), timing cards, ToF (time-of-flight) measuring devices such as in radiation detectors, diagnostic equipment, etc.

TDCs typically employ counters. A counter is a circuit for counting edges, pulses or cycles of a signal, which is typically a periodic signal such as a measurement clock. The measurement clock is provided as an input to the counter, and the counter normally generates a multi-bit count value corresponding to every edge, pulse or cycle of the measurement clock.

A counter for a TDC may generally need to satisfy one or more desirable features such as, for example, high speed, low power consumption, minimal or no metastability issues in the design of its internal circuitry as well as other circuitry in the TDC that operate on the count values generated by the counter, etc.

Aspects of the present disclosure are directed to the design of a counter for a TDC.

BRIEF DESCRIPTION OF THE VIEWS OF DRAWINGS

Example embodiments of the present disclosure will be described with reference to the accompanying drawings briefly described below.

FIG. 2 is an example timing diagram illustrating the manner in which a TDC generates digital values representing time instants of occurrence of events.

FIG. 11 shows a table with entries illustrating the manner in which selection logic for a multiplexer is implemented for outputs of an asynchronous portion of a coarse counter, in an embodiment of the present disclosure.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A time-to-digital converter (TDC) according to an aspect of the present disclosure includes a counter and a digital core. The counter is designed to generate a sequence of counts representing a respective count of cycles of a first clock signal that have occurred up to the corresponding time point of generation of the count. The counter includes an asynchronous circuit and a synchronous circuit to respectively generate a first set of bits and a second set of bits of each of the sequence of numbers. In an embodiment, the first set of bits represent the more significant bits compared to the second set of bits in the represented number. The digital core is designed to process a pair of counts of the sequence of counts.

In an embodiment, the digital core may be designed to generate a difference of a pair of counts of the sequence of counts. A first count of the pair represents a first event on a first input signal, and a second count of the pair represents a second event on a second input signal. The difference represents a time difference between occurrence of the first event and the second event.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
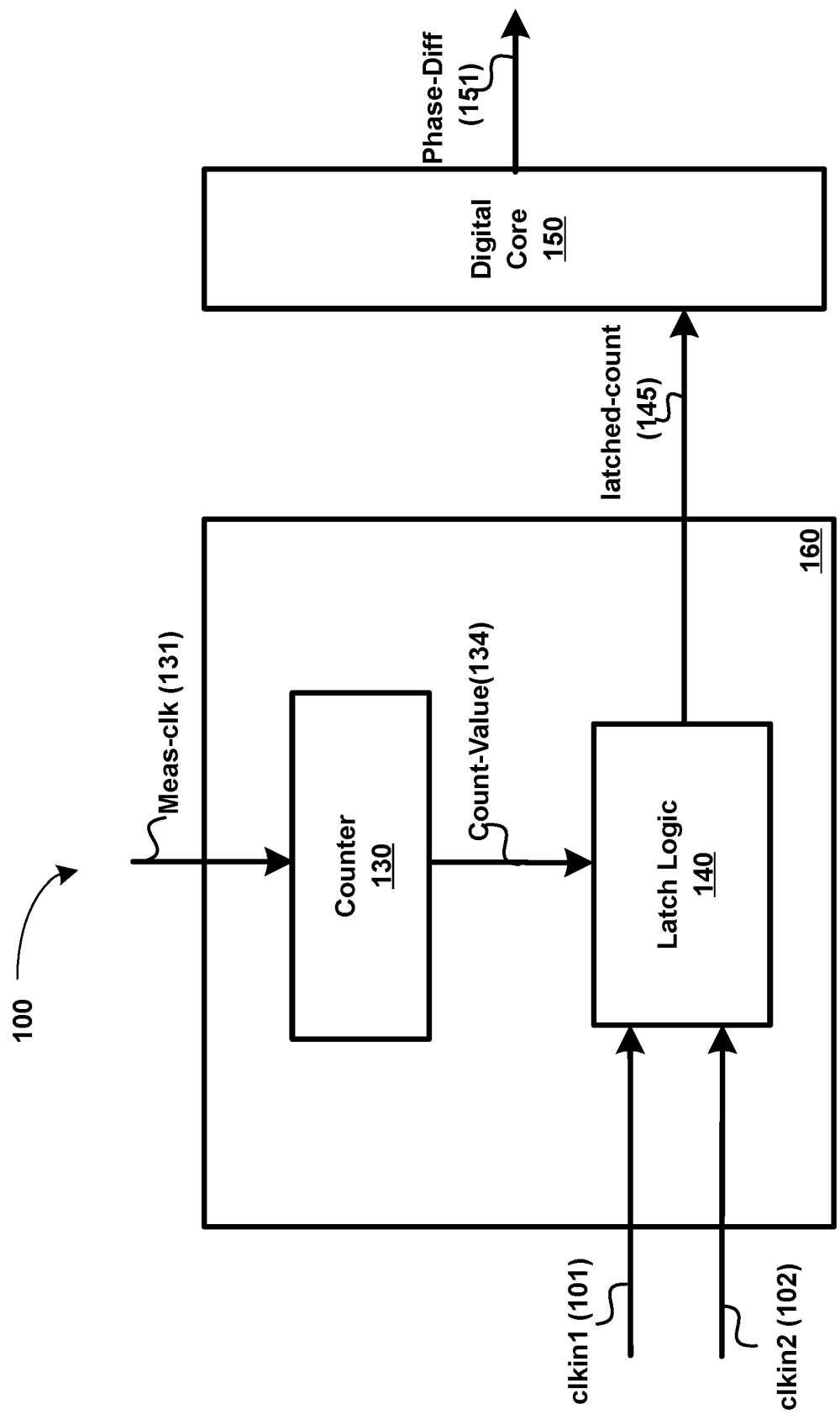
FIG. 1 is a block diagram of an example device in which several aspects of the present disclosure can be implemented.

FIG. 1 is a block diagram of an example time-to-digital converter (TDC) in which several aspects of the present disclosure can be implemented. TDC 100 is shown containing count logic 160 and digital core 150. Count logic 160 is in turn shown containing counter 130 and latch logic 140. The specific details of TDC 100 shown in FIG. 1 are merely by way of illustration, and a TDC implemented according to aspects of the present disclosure can have more or fewer blocks, and can process more than two inputs or events simultanoesuly.

Counter 130 is shown as receiving a measurement clock (meas-clk 131). In an embodiment, Counter 130 is designed to count the number of pulses (or equivalently, the number of cycles) of, or the number of a sequence (example, 2, 3, or N in general, N being an integer) of successive pulses of, meas-clk 131, and provides each count value on path 134 (count-value). Alternatively, or additionally, counter 130 can be designed to be also capable of counting the number of edges (rising as well as falling) of meas-clk 131. In general, counter 130 is implemented to count the number of 'transitions of interest' of clock 131, the transitions of interest being any of those noted above. The frequency of meas-clk 131 determines the resolution with which TDC 100 can represent time instants of occurrences of events in one or both of input signals 101 and 102. The greater the frequency, the better is the resolution. Counter 130 can be implemented, for example, as an up-counter, a down-counter, or for other types of counting such as incrementing or decrementing by an integer greater than one, modulus-N counter, wherein N is a natural number, etc. Based on the implementation of counter 130, other circuits, such as latch logic, digital core, etc., can be correspondingly implemented to process the count values 134 generated by counter 130. Counter 130 may be designed to increment count-value 134 at either every rising edge or every falling edge of meas-clk 131. Counter 130 may be designed to output a count value of zero upon reset (signal not shown). The description herein, however, is provided in the context of a counter that is designed to count the number of cycles of a clock.

Latch logic 140 is shown receiving input signals clkin1 (101) and clkin2 (102), each of which may be a binary (or in general a digital/discrete) waveform, such as for example periodic clock signals. It is often of interest to measure the time elapsed between a pair of events on a same input signal or between two input signals. Thus, for example, it may be desired to obtain a digital number representing the time interval between a pair of edges (representing the events) of one of the clocks 101 and 102. Alternatively, it may be of interest to obtain a digital number representing the time interval between an edge of clock 101 and a nearest edge of clock 102, the respective edges representing events.

Latch logic 140 is designed to capture (store) the count value on path 134 upon the occurrence of the corresponding event, and forward the count value on path 145 (latched-count) to digital core 150. Latch logic 140 may be implemented in a known way.

Digital core 150 receives the latched counts on path 145 and processes the latched counts to generate digital values representing time intervals between events of interest in one or both of inputs signals 101 and 102. For example, as shown in FIG. 1, digital core 150 determines the phase difference between input signals 101 and 102, and provides the phase difference as an output on path 151 (phase-diff).

It is noted here that although count logic 160 is shown in FIG. 1 as receiving two input signals (clocks 101 and 102), in general count logic 160 can be implemented to receive more or fewer inputs. For example, count logic 160 may be implemented to receive only one input and to generate a digital value representing some event of interest signaled by the single input (such as an edge). In such a case, TDC 100 may be implemented to have multiple ones of count logic 160, one each for one input, and digital core 150 may be designed to receive and process the latched count values from all of such count logic 160 to generate digital values on path 151 representing events or time intervals of interest.

In an embodiment, digital core 150 is implemented as described in U.S. application Ser. No. 17/662,667, filed May 10, 2022, entitled "Time-To-Digital Converter (TDC) Measuring Phase Difference between Periodic Inputs", and assigned to the assignee of the present application, the contents of which are incorporated herein by reference in their entirety.

FIG. 2 is an example timing diagram illustrating the manner in which TDC 100 of FIG. 1 generates digital values representing time instants of occurrence of events. Example waveforms for input clocks 101 and 102, meas-clk 131, count-value 134 and latched-count 145 are shown there. It is assumed in the example of FIG. 2 that phase difference between input clocks 101 and 102 is desired to be determined by TDC 100.

The rising edges of input clocks 101 and 102 are shown as occurring at time instants t21 and t22, and t23 and t24 respectively. Counter 130 starts with an initial count of zero, and increments count value 134 at every rising edge of meas-clk 131. Accordingly, count-value 134 changes (increments) with each rising edge of meas-clk 131, and the changes are indicated by the hashed waveform for count-value 134. The count-values (134) at t21, t22, t23 and t24 are respectively indicated as C1, C2, C3 and C4. Thus, latch logic 140 latches the values C1, C2, C3 and C4 of count-value 134 at respective time instants t21, t22, t23 and t24. Latch logic 140 forwards each of the values C1, C2, C3 and C4 on path 145. Digital core 150 processes the values received on path 145 to determine the phase difference between input clocks 101 and 102 as the difference between C1 and C2, or C3 and C4.

Figure 3A:
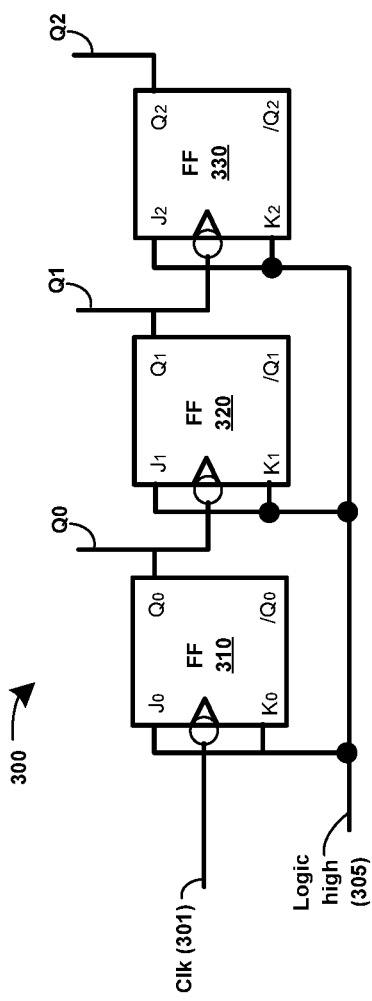
FIG. 3A is a block diagram of a conventional asynchronous counter.
Figure 3B:
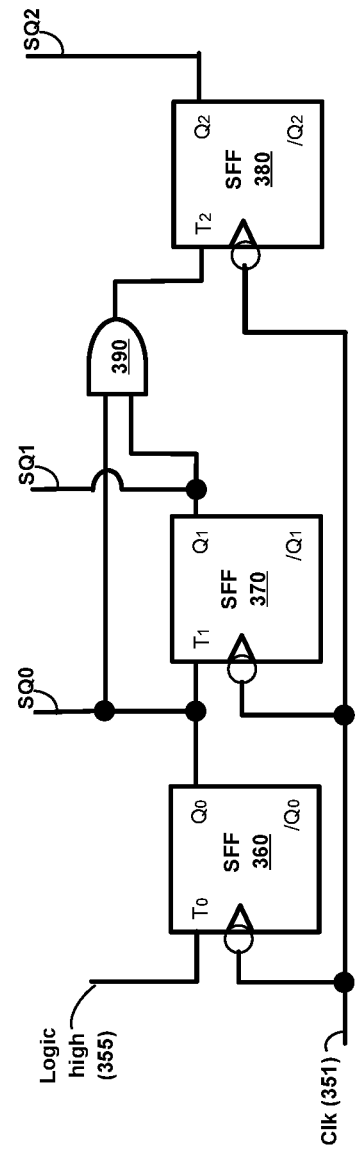
FIG. 3B is a block diagram of a conventional synchronous counter.

In some prior techniques, counter 130 is implemented either as an asynchronous (ripple) counter or as a synchronous counter, both well known in the relevant arts, and examples of which are shown in FIGS. 3A and 3B respectively.

FIG. 3A shows a 3-bit (3-stage) asynchronous up counter. Counter 300 is shown built of three negative-edge-triggered JK flip-flops. The J and K terminals of each of flip-flops (FF) 310, 320 and 330 are tied to logic high (305). Clk 301 represents a measurement clock, and is applied to the (negative-edge triggered) clock input of FF 310. The outputs (Q0 and Q1) of respective flip-flops 310 and 320 are connected to the clock inputs of FF 320 and 330 respectively. Q0, Q1 and Q2 are the outputs of counter 300, which together provide a current value of count generated by counter 300 in response to oscillations of clock 301. Q0 is the least significant bit (LSB) and Q2 is the most significant bit (MSB) of counter 300.

FIG. 3B shows a 3-bit (3-stage) synchronous up counter. Counter 350 is shown built of three negative-edge-triggered toggle (T) flip-flops SFF 360, 370 and 380. The T input terminal of SFF 360 is tied to logic high (355). Clk 351 represents a measurement clock, and is applied to the (negative-edge triggered) clock inputs of all three flip-flops 360, 270 and 380. Output SQ0 of SFF 360 is connected to T input terminal of SFF 370. The outputs SQ0 and SQ1 of respective flip-flops 360 and 370 are passed through an AND gate 390, and the logical AND output of AND gate 390 is provided as input to SFF 380. SQ0, SQ1 and SQ2 are the outputs of counter 350, which together provide a current value of count generated by counter 350 in response to oscillations of clock 301. SQ0 is the least significant bit (LSB) and SQ2 is the most significant bit (MSB) of counter 300.

Asynchronous counters and synchronous counters are each associated with advantages and disadvantages. For example, in comparison with synchronous counters, asynchronous counters may consume relatively less power, and may also be easier to implement since they do not usually require additional logic to generate the clock inputs to subsequent flip-flops or stages. However, the maximum operating frequency (generally frequency of the clock to the flip-flop at the least significant bit position) of an asynchronous counter may be lower than that of a comparable synchronous counter. Further, the use of an asynchronous counter in a TDC may pose a greater problem of metastability (in the form of a wider/longer metastability window) than a synchronous counter in the value latched by latch logic 140 when an event (e.g., rising edge) specified by an input clock signal (e.g., 101 or 102 of FIG. 1) occurs when the counter's outputs are changing.

According to an aspect of the present disclosure, a TDC is implemented with a (hybrid) counter having a synchronous portion (synchronous circuit) and an asynchronous portion (asynchronous circuit), as described next.

3. Counter Design

Figure 4:
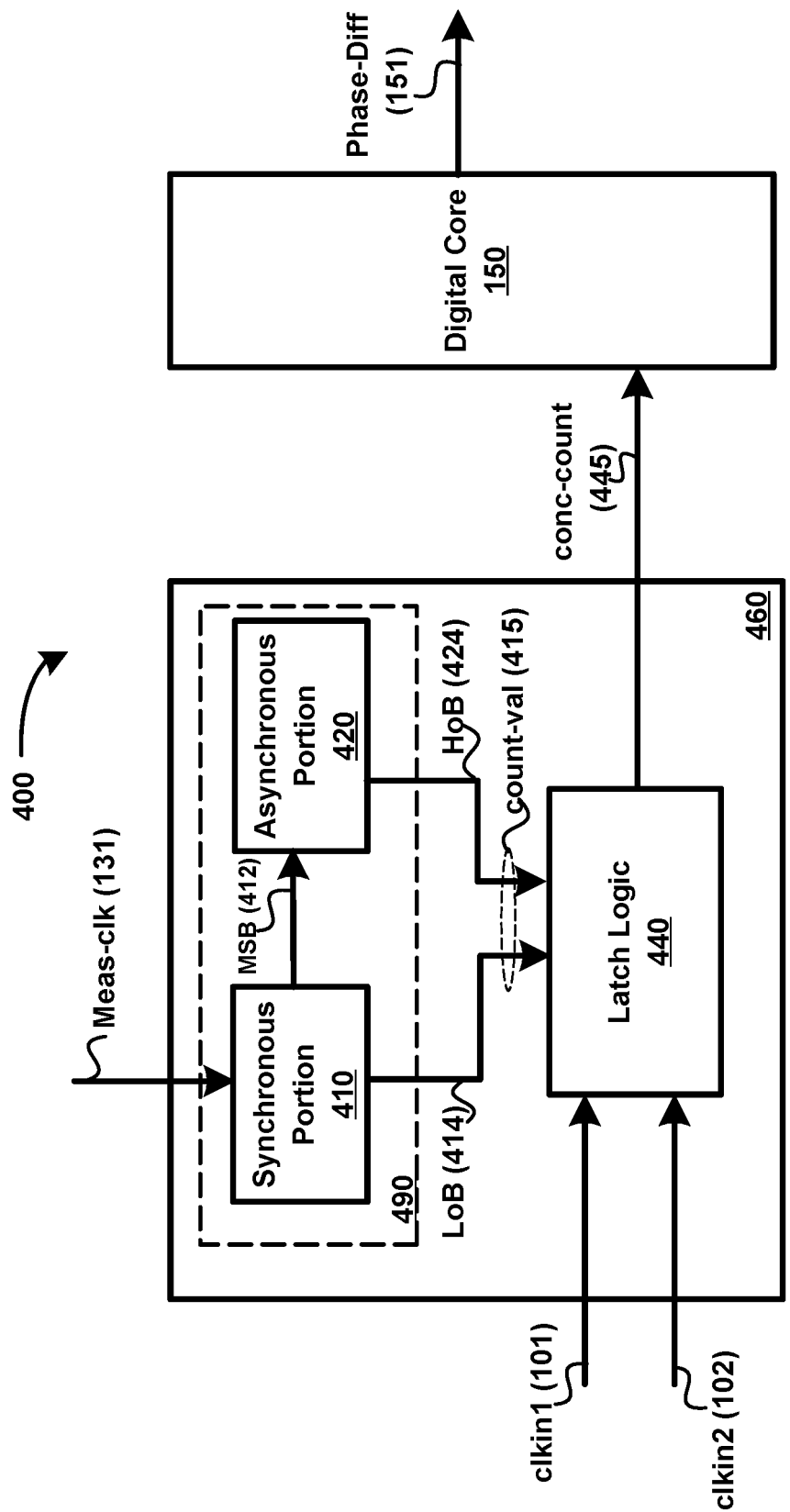
FIG. 4 is a block diagram of a TDC employing a counter designed to have a synchronous portion as well as an asynchronous portion, in an embodiment of the present disclosure.

FIG. 4 is a block diagram of a TDC employing a counter designed to have a synchronous portion as well as an asynchronous portion, in an embodiment of the present disclosure. TDC 400 is shown containing count logic 460 and digital core 150. Digital core 150 is implemented as described above with respect to FIG. 1. Count logic 460 is shown containing counter 490 and latch logic 440. Counter 490 is in turn shown containing synchronous portion 410 and asynchronous portion 420, and may be referred to as a hybrid counter. Latch logic 440 may be implemented substantially similar to latch logic 140 of FIG. 1, and its description is not repeated below in the interest of conciseness.

Synchronous portion 410 of counter 490 is shown connected to receive a measurement clock meas-clk 131 (which is the same as that in FIG. 1) as input. Synchronous portion 410 counts the number of cycles/pulses of meas-clk (131), and contains multiple flip-flops (i.e., stages) connected to form a synchronous counter that generates the lower-order bits (LoB 414) (i.e., lesser significant bits) of the count value generated by counter 490 on path 415 (count-val). The number of flip-flops (stages), i.e., the bit-width of synchronous portion 410, may be determined, for example, based on the bit-width of the counter output count-val (415) and other considerations such as speed, power-consumption, overall complexity, etc., of counter 490, as well as the target application of TDC 400.

Asynchronous portion 420 of counter 490 is shown connected to receive the most significant bit (MSB) 412 of synchronous portion 410 as an input clock, and counts the number of cycles/pulses of MSB 412. Asynchronous portion 420 contains multiple flip-flops (i.e., stages) connected to form an asynchronous (or ripple) counter, which generates the higher-order bits (HoB 424) (i.e., more significant bits) of the count generated by counter 490 on path 415 (count-val). The number of flip-flops (stages), i.e., the bit-width of asynchronous portion 420 may be determined, for example, based on the bit-width of the counter output count-val (415) and other considerations such as speed, power-consumption, coverall complexity, etc., of counter 490, as well as the target application of TDC 400.

Although synchronous portion 410 and asynchronous portion 420 are described herein as generating the lesser significant bits and the more significant bits respectively, in an alternative embodiment, asynchronous portion 420 receives meas-clk and generates the lesser significant bits, and synchronous portion 410 receives MSB of the count generated by portion 420 and generates the more significant bits Each of portions 410 and 420 may be designed to output a count value of zero upon reset (not shown). It is further noted here, that although portions 410 and 420 are noted as being up-counters that increment their counts at every cycle of the corresponding input clock meas-clk (131) and MSB (412), they can also be implemented as down-counters or modulus-N counters (wherein N is smaller than 2^bit-width of the portion (^ representing a 'power of' operation)). In general, portions 410 and 420 of counter 490 are implemented to count the number of 'transitions of interest' of the corresponding input clocks 131 and 412. Therefore, in general, the counts generated by the portions 410 and 420 only need to be proportional to the number of clock edges, number of cycles/pulses (or the number of a sequence of multiple successive cycles) of the corresponding clock, namely Meas-clk (131) or MSB (412), although they are allowed to overflow and start from 0 again, and portions 410 and 420 can be implemented in any form as long as the above proportionality requirement is satisfied. The description herein, however, is provided in the context of a counter that is designed to count the number of cycles of a clock.

Digital core 150 processes the values received on path 445 to generate digital values representing time relationships between events on one or both of input signals (101 and 102). In an embodiment, the time relationship is the phase difference between input clocks 101 and 102.

Figure 5:
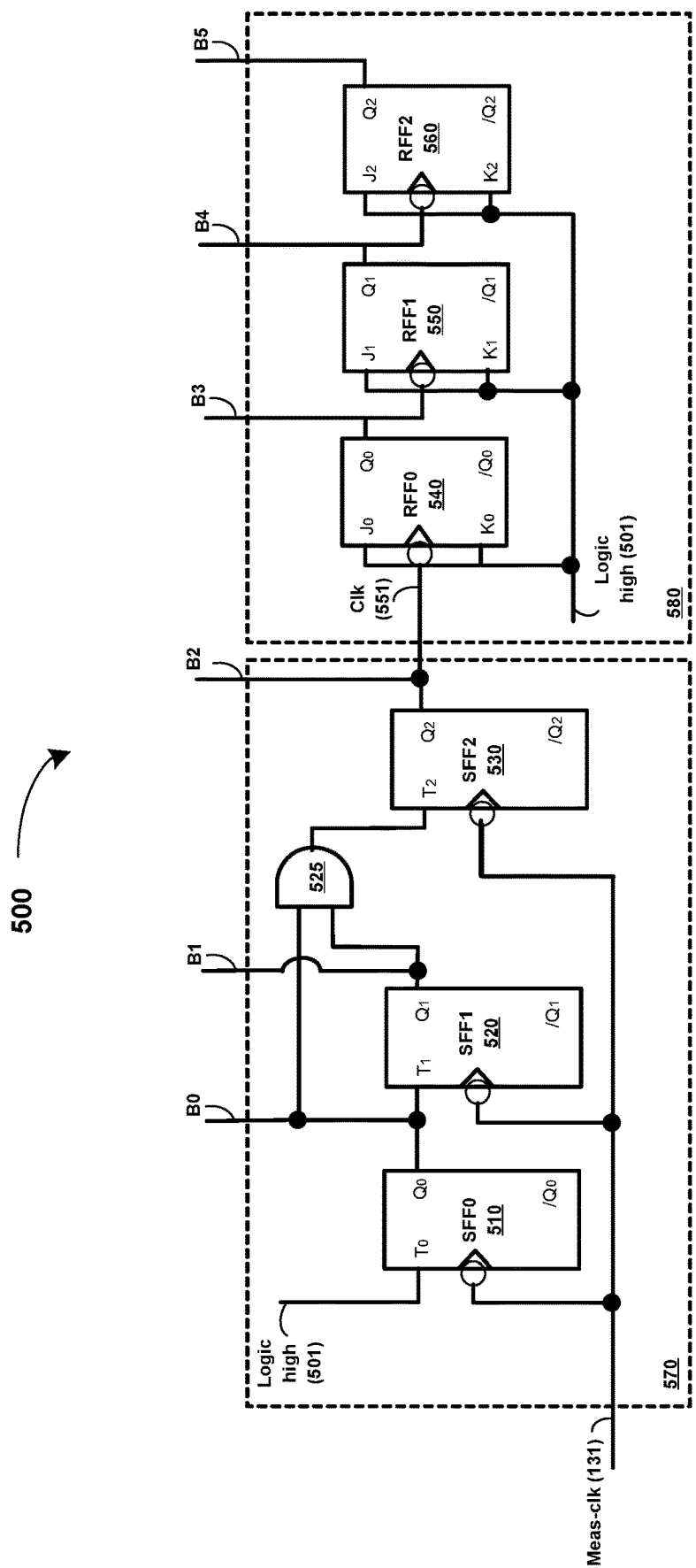
FIG. 5 is a block diagram illustrating a hybrid counter in an embodiment of the present disclosure.

An example illustration of portions 410 and 420 of counter 490 is provided in FIG. 5. Counter 500, which is an example of a hybrid counter such as counter 490, is shown containing flip-flops SFF0 (510), SFF1 (520), SFF2 (530), RFF0 (540), RFF1 (550) and RFF2 (560), and AND gate 525. In the example, counter 500 is a 6-bit counter, and the output bits are shown as being provided on terminals marked B0, B1, B2, B3, B4 and B5. It may be observe that flip-flops 510, 520 and 530 form a synchronous counter portion (570, which corresponds to portion 410 of FIG. 4), while flip-flops 540, 550 and 560 form an asynchronous counter portion (580, which corresponds to portion 420 of FIG. 4).

The synchronous counter portion (570) is shown implemented as a 3-bit up-counter, built of three negative-edge-triggered toggle (T) flip-flops, 510, 520 and 530. The T input terminal of SFF0 510 is tied to logic high (501). Meas-clk 131 is applied to the (negative-edge triggered) clock inputs of all three flip-flops 510-530. Output Q0 of SFF0 510 is connected to T input terminal of SFF1 520. The outputs Q0 and Q1 of respective flip-flops 510 and 520 are passed through an AND gate 525, and the logical-AND output of AND gate 525 is provided as T input to flip-flop 530. B0, B1 and B2 are the outputs of the synchronous counter, and form the lower significant bits of counter 490.

The asynchronous counter portion is shown implemented as a 3-bit up-counter, built of three negative-edge-triggered JK flip-flops 540, 550 and 560. The J and K input terminals of RFF0 540, RFF1 550 and RFF2 560 are all tied to logic high (501). The most significant bit (MSB) B2 of synchronous counter portion is applied to the (negative-edge triggered) clock input of flip-flops 540. The outputs Q0 and Q1 of respective flip-flops 540 and 540 are connected to the clock inputs of flip-flops 550 and 560 respectively. B3, B4 and B5 are the outputs of the synchronous counter, and form the lower significant bits of counter 490.

While each of portions 570 and 580 are shown to be 3-bit counters, in general, the bit-width of each of those counters can be lesser or greater than 3, and the counters can have different bit-widths.

The hybrid counter design described above enables balancing of the advantages and disadvantages associated with synchronous-only and asynchronous-only counters used in prior techniques.

According to another aspect of the present disclosure, a TDC is designed to have a count logic block that additionally addresses the potential problem of metastability in latching the counter's output when an event specified by an input signal occurs when the counter's outputs are changing, as briefly described next. Additionally, an example implementation of a latch logic in such a TDC is also described.

4. Metastability-Free Latch Logic

Figure 6:
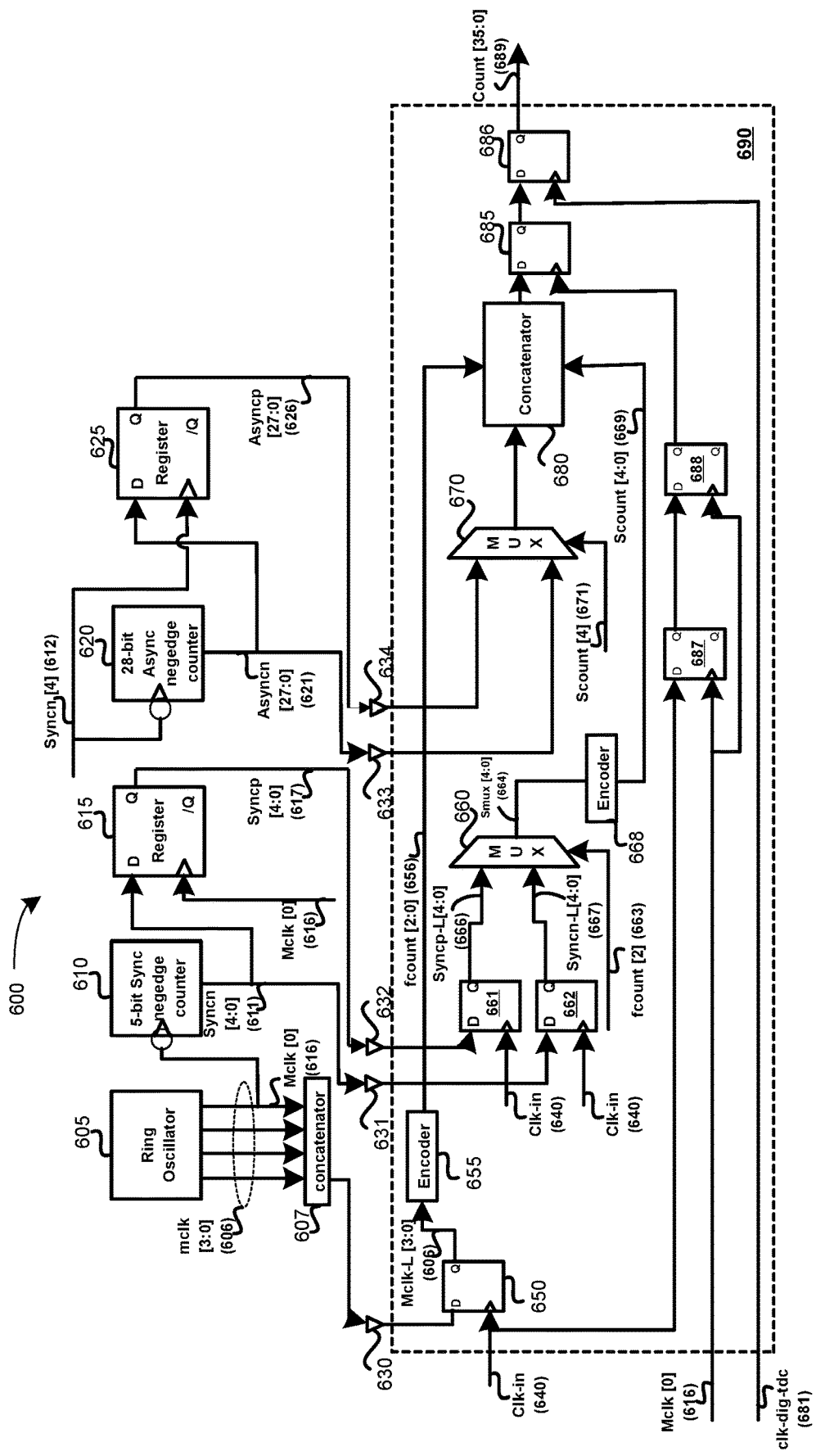
FIG. 6 is a block diagram of a count logic of a TDC that employs a hybrid counter and also mitigates or avoids metastability issues, in an embodiment of the present disclosure.

FIG. 6 is a block diagram of a count logic of a TDC that employs a hybrid counter and also mitigates or avoids metastability issues, in an embodiment of the present disclosure. Count logic 600, which can be implemented in place of count logic 460 of FIG. 4, is shown containing ring oscillator 605, concatenator 607, 5-bit sync-negedge-counter 610, register 615, 28-bit async-negedge-counter 620, register 625, buffers 630, 631, 632, 633 and 634, register 650, encoder 655, registers 661 and 662, multiplexer (MUX) 660, encoder 668, MUX 670, concatenator 680 and registers 685, 686, 687 and 688. The components/blocks forming the latch logic is denoted by block 690. Components 610, 615, 620 and 625 together represent a 'coarse counter' and correspond to counter 490 of FIG. 4. Ring oscillator 605 forms a 'fine counter'. Alternatively, the combination of ring oscillator 605 and encoder 655 may be viewed as the 'fine counter'. In the description provided below, the coarse counter is designed to count the number of cycles of the input clock mclk[0] (616). However, in general, the coarse counter or portions thereof may implemented to count the number of 'transitions of interest' of the corresponding input clocks mclk[0] and/or sync[4].

Count logic 600 generates a 36-bit digital value representing the time of occurrences of rising edges of input clock clk-in (640). Clk-in (640) may correspond to either one of clkin1 (101) and clkin2 (102) of FIG. 4. In FIG. 6, latch logic 690 is shown and described as generating a digital value representing events (here rising edges) of one input clock only, and can be modified or augmented to accommodate more input clocks. Further, the specific types and bit-widths of the counters, ring oscillator, etc., are provided merely by way of illustration, and other types, bit-widths, etc., can also be used. The operation of count logic 600 is briefly described next, with joint reference to FIGS. 6, 7, 8 and 9.

Ring oscillator 605 contains three delay elements and an inverter, and is designed to generate four phases of a master clock mclk. In alternative embodiments, ring oscillator 605 may be implemented using other building blocks, such as delay-locked loops (DLL), as would be apparent to those skilled in the relevant arts, and ring oscillator 605 may be viewed as a delay chain in general. In some embodiments, ring oscillator 605 is a VCO (voltage-controlled oscillator of a PLL (Phase Locked Loop, external to TDC 100, or used in conjunction with it). The four outputs together labeled as 608 are the 4 respective phases [3:0] of the master clock. The 4 phases mclk[3], mclk[2], mclk[1] and mclk[0] are 45 degrees apart, and their binary states during one period of mclk are shown in columns C1, C2, C3 and C4 of table 700 of FIG. 7. It may be observed that in one period of the master clock, there are 8 distinct states of the combination of the 4 phases. The decimal values and encoded values of the 8 states are shown in columns C5 and C7. Concatenator 607 concatenates the 4 phases. Buffer 630 provides buffering to the 4 phase values. It is noted that the specific number of phases is noted merely by way of illustration, and more phases can also be generated and subsequently used to improve the resolution of the TDC.

Register 650 is a 4-bit storage element and stores the value of the 4 phase outputs at the rising edge of input clock clk-in (640). Encoder 655 encodes the 8 states into the 3-bit encoded values shown in column C7 of FIG. 6. Thus, the combination of ring oscillator 604 and blocks 607, 650 and 655 operates to provide a fine count having a resolution equal to ⅛ of the period of master clock mclk. In an embodiment, the frequency of mclk is 2 giga-hertz (GHz), and therefore, the resolution with which the count (689) generated by count logic 600 is 62.5 picoseconds (ps). The combination of ring oscillator 605 and blocks 607, 650 and 655 generates a 'fine count', and may be referred to as a 'fine counter'.

Counters 610 and 620 respectively represent synchronous portion 410 and asynchronous portion 420 of FIG. 4, and together represent (coarse) counter 490. The resolution with which the output of the coarse counter can represent time instant of an event is (62.5×8), i.e., 500 ps. In the example of FIG. 6, counter 610 is a 5-bit counter that increments its count (first coarse output) at every falling edge (negative edge) of mclk. Thus, phase 0, i.e., mclk[0] of mclk is shown as being provided to all the flip-flops within counter 610. Counter 610 generates a 5-bit count value syncn[4:0] (611).

Counter 620 is a 28-bit asynchronous counter, and receives the most significant bit (MSB) syncn[4] (612) of counter 610 as the clock input to the first flip-flop (i.e., flip-flop in the least significant bit position) in counter 620. Counter 620 increments its count (second coarse output) at every falling edge (negative edge) of sync[4] (612), and generates a 28-bit count value async[27:0] (621).

To overcome the metastability problem noted above, the outputs syncn[4:0] (611) and async[27:0] (621) are each stored in respective registers that are positive edge-triggered storage components. Thus, register 615 stores syncn[4:0] (611) at the rising edge of mclk[0] (616), and register 625 stores asyncn[27:0] (621) at the rising edge of syncn[4] (612). Thus, while counters 610 and 620 update their count values at every falling edge of the corresponding clocks, the updated count values are stored a half-clock cycle later at the positive/rising edge of the corresponding clocks. Registers 615 and 625 provide the respective outputs syncp[4:0] (617) (first replica coarse output) and asyncp[27:0] (626) (second replica coarse output). The outputs of counter 610, register 615, counter 620 and register 625 are buffered by respective buffers 631, 632, 633 and 634. Instead of registers, replica counters can also be used in place of registers 615 and 625.

Since count values are generated/stored at both positive edge and negative edge of the corresponding clock, it is ensured (or at least rendered highly probable) that at least one of the count values will be stable and unchanging at the time instant of an event (here positive edge) of input clock clk-in 640. Thus, it is only necessary to select the appropriate count value. With respect to outputs of synchronous portion 610 and register 615, the output of buffers 631 and 632 are respectively stored in registers 661 and 662 at the rising edge of clk-in (640), and the appropriate (stable) one of the respective outputs syncp-L[4:0] (666) and syncn-L[4:0] (667) is selected as the output Smux [4:0] (664) of MUX 660. Similarly, with respect to outputs of asynchronous portion 620 and register 625, the output of buffers 633 and 634 are respectively available at MUX 670 and the appropriate (stable) one is selected as the output of MUX 670.

It is noted here that the type of edge (rising/positive or falling/negative) of the respective clock signals at the clock inputs of components 610 and 620 only need to be the opposite of the respective clock signals at the clock inputs of registers 615 and 625. Therefore, the specific type of edge applied to register 615 and 625 can also be rising edges of the corresponding clocks, with the type of edge applied to components 610 and 620 being falling edges of the corresponding clocks.

The manner in which the outputs of MUX 660 and 670 are determined is described next with respect to FIGS. 7, 8 and 9.

Figure 7:
FIG. 7 shows a table with entries illustrating the manner in which selection logic for a multiplexer is implemented for outputs of a synchronous portion of a coarse counter, in an embodiment of the present disclosure.

The selection logic for MUX 660 is obtained from the values in columns C6 and C7 of table 700 of FIG. 7. In column C6, a value of 0 for select input fcount[2] (663), i.e., the MSB of output of encoder 655, indicates that syncn-L[4:0] (667) is selected as the output of MUX 660. A value of 1 for select input fcount[2] (663) indicates that syncp-L[4:0] (666) is selected as the output of MUX 660. The reason for such selection can be understood from FIG. 8.

Figure 8:
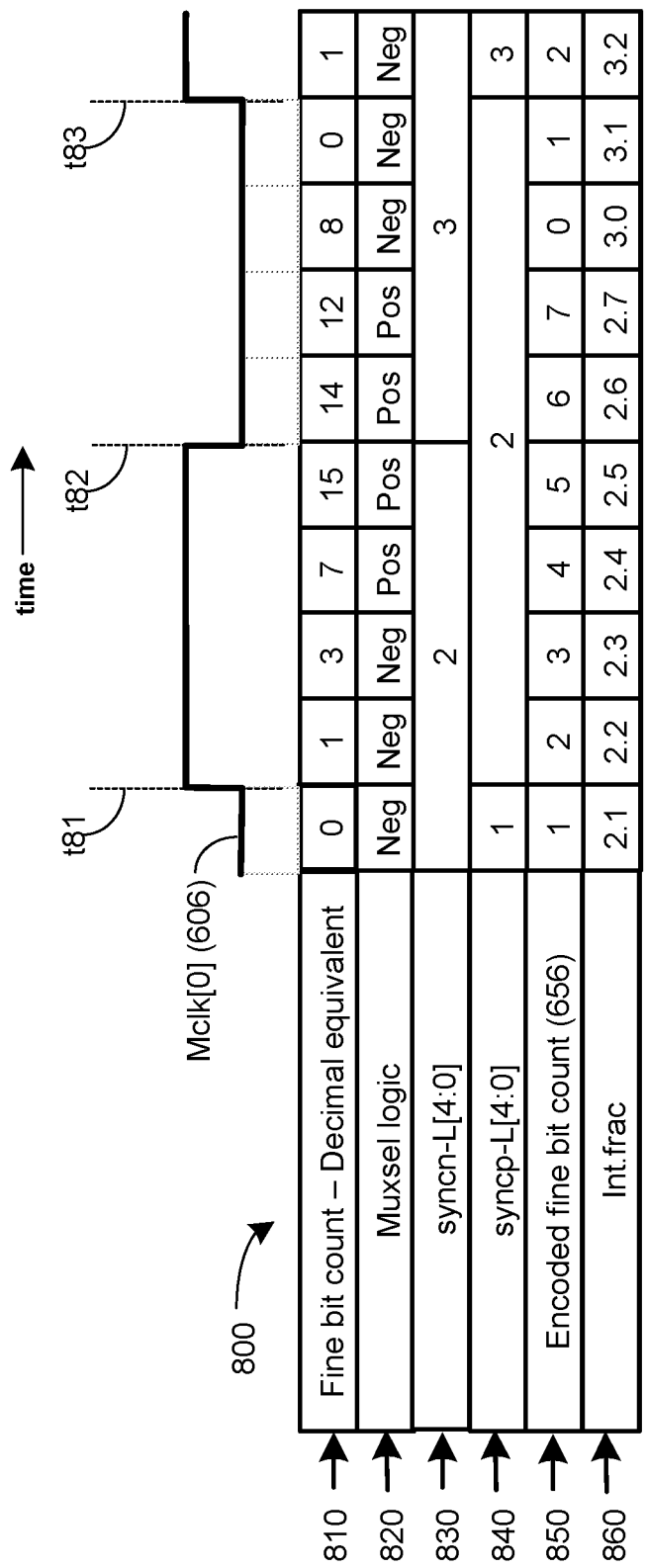
FIG. 8 is a another diagram used to illustrate the manner in which selection logic for a multiplexer is implemented for outputs of a synchronous portion of a coarse counter, in an embodiment of the present disclosure.

Table 800 of FIG. 8 is shown containing rows 810-860. One cycle of mclk[0] (606) is also shown in FIG. 8. At time instants t81 and t83, two rising edges of mclk[0] are shown as occurring, and at t82, a falling edge of mclk[0] is shown as occurring. The output of counter 610 would change at falling edge t82, but would be stable at rising edges t81 and t83. The output of register 615 would change at rising edges t81 and t83, but would be stable at falling edge t82.

Row 810 shows the possible values of the decimal equivalent (also shown in column C5 of FIG. 7) of the fine counter, and row 850 shows the corresponding encoded fine counts (also shown in column C7 of FIG. 7). Row 820 shows which of syncp-L[4:0] (666) and syncn-L[4:0] (667) should be selected as the output of MUX 660 corresponding to each entry in row 810 or 850. An entry 'Neg' indicates that syncn-L[4:0] must be selected, while an entry 'Pos' indicates that syncp-L[4:0] must be selected. Rows 830 and 840 show example count values of syncn-L[4:0] and syncp-L[4:0] respectively. Row 860 shows the final concatenated count comprising of fine count and synchronous counters, indicating that with correct MUX selection logic a monotonically increasing count is obtained.

In order to prevent or minimize the probability of metastability, it may be apparent from FIG. 8 that in the vicinity of rising edges of mclk[0], syncn-L[4:0] must be selected as the output of MUX 660 since syncn-L[4:0] would be stable because it changes only at the falling edges of mclk[0]. Similarly, in the vicinity of falling edges of mclk[0], syncp-L[4:0] must be selected as the output of MUX 660 since syncp-L[4:0] would be stable because it changes only at the rising edges of mclk[0].

From row 850 as well as column C7, it may be observed that whenever syncn-L[4:0] is to be selected as the output, MSB of the 3-bit binary value of fcount[2:0] (656) is a zero. Whenever syncp-L[4:0] is to be selected as the output, MSB of the 3-bit binary value of fcount[2:0] (656) is a one. Hence, fcount [2] (663) is used to select the output of MUX 660.

Figure 12:
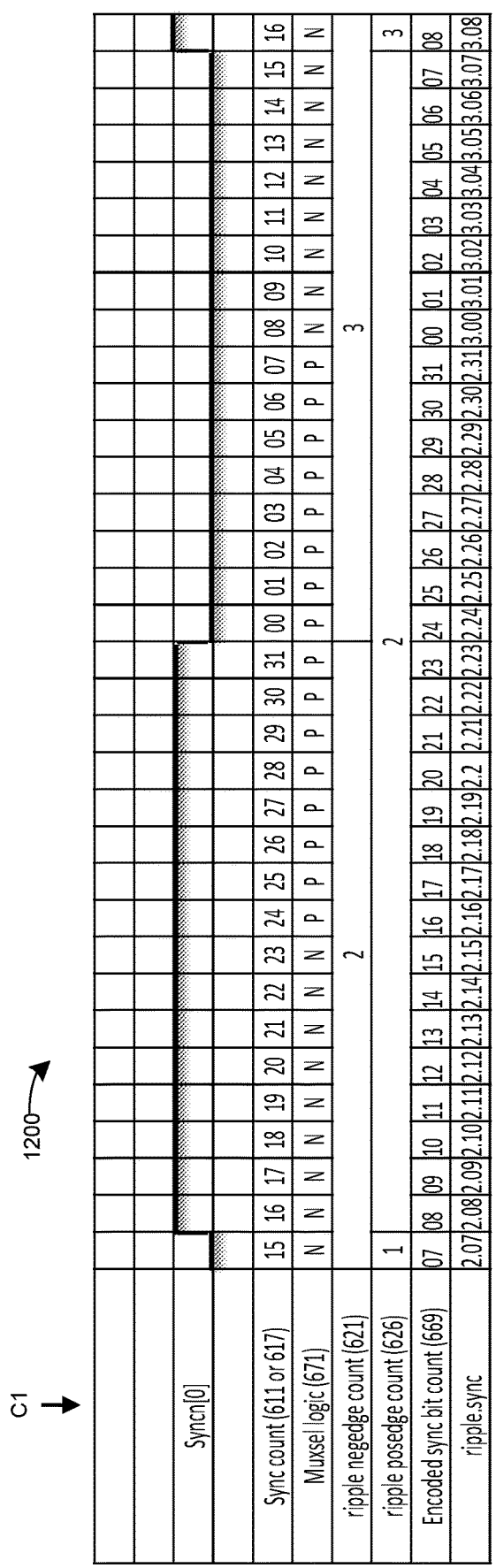
FIG. 12 is another diagram used to illustrate the manner in which selection logic for a multiplexer is implemented for outputs of an asynchronous portion of a coarse counter, in an embodiment of the present disclosure.

Continuing with the description of FIG. 6, the output of MUX 660, selected as described above, is encoded in encoder 668, and the encoded output Scount[4:0] (669) is provided to concatenator 680. Encoder 668 is needed to select stable values out of the pair of counts output by blocks 620 and 625. The encoding logic of encoder 668 as well as the logic used for the selection of which one of the two inputs of MUX 670 is to be forwarded as the output is illustrated in tables 1100 and 1200 of FIGS. 11 and 12 respectively. Column C1 of table 1200 lists various signals, and the values of the signals are in the corresponding rows. The logic of FIGS. 11 and 12 are self-explanatory and substantially similar to that used for selecting which of synchronous counts 666 and 667 is to be forwarded as the output of MUX 660, and the description is not provided in the interest of conciseness.

The output of MUX 670 is determined based on Scount[4] (671), which is the MSB of Scount [4:0] (669), which in turn is the selected and encoded output of the synchronous portion of the coarse counter. The reason for the use of Scount[4] (671) to select the output of MUX 670 is similar to the select logic used for selecting the output of MUX 660, and is illustrated below briefly with respect to FIG. 9. The output of MUX 670 (which is the selected output of the asynchronous portion of the coarse counter) is forwarded to concatenator 680. Encoded fine count fcount[2:0] (656) is also forwarded to concatenator 680.

Figure 9:
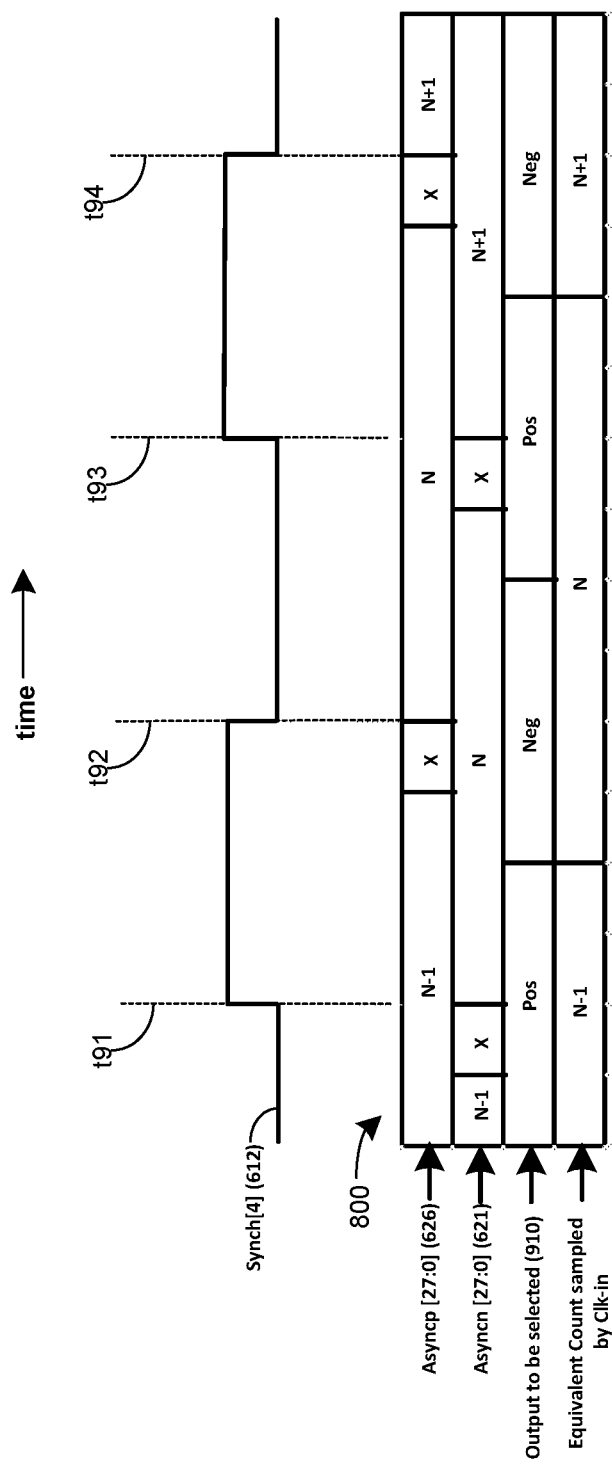
FIG. 9 is a diagram used to illustrate the manner in which selection logic for a multiplexer is implemented for outputs of an asynchronous portion of a coarse counter, in an embodiment of the present disclosure.

FIG. 9 shows a table 900 containing various entries, and along with the waveform 612 illustrates the logic used in selecting the output of MUX 670. Two rising edges of signal 612 are shown as occurring at t91 and t93, while two falling edges are shown at t92 and t94. With respect to outputs of asynchronous portion 620, the output of buffers 631 and 632 are respectively available at MUX 670 and the appropriate (stable) one is selected as the output of MUX 670. It may be apparent from FIG. 9 that in the vicinity of rising edges of signal 612, asyncn[27:0] must be selected as the output of MUX 670 since asyncn[27:0] would be stable because it changes only at the falling edges of signal 612. Similarly, in the vicinity of falling edges of signal 612, asyncp[27:0] must be selected as the output of MUX 670 since asyncp [27:0] would be stable because it changes only at the rising edges of signal 612. The first two rows of table 800 shows example entries for asyncp [227:0] (626) and asyncn[27:0] (621) respectively. The third row 910 indicates which output is to be selected. An entry 'pos' indicates that the output of register 625 is to be selected as the output of MUX 670, while an entry 'neg' indicates that the output of portion 620 is to be selected as the output of MUX 670. The fourth row of table 900 indicates the specific count value selected at corresponding rising edges of clk-in. The value of Scount[4] (671) is used to select the output of MUX 670, wherein a logic level 0 of Scount[4] selects asyncn[27:0] as the output, while a logic level of 1 selects asyncp[27:0] as the output of MUX 670.

It is noted herein that the technique for avoiding metastability described above is not applicable when counters 610 and 620 are designed to count every edge (rising as well as falling) of the corresponding clock (mclk[0] (611) and sync[4] (612).

Concatenator 680 concatenates the received inputs to form a single 36-bit count value, with the fine count fcount [2:0] in the least significant position, Scount[4:0] in the middle, and the 28-bit output of MUX 670 in the most significant position. It is noted here that using synchronous circuitry for generating the lesser significant bits of the coarse counter, and asynchronous circuitry for generating the more significant bits of the coarse counter renders the implementation of selection logic for MUX 660 as well as encoder 668 simpler since the metastability window (maximum duration for changing of the outputs of the synchronous portion of the coarse counter) is lesser due to use of synchronous circuitry. In other words, the use of the asynchronous portion for generating the lesser significant bits of the coarse counter would render such logic to be more complicated. In general, the above noted approach simplifies the implementation of latch logic 690.

Input signal clk-in (640) is synchronized with respect to the clock domain (which is synchronous with mclk[0] (616)) on which TDC 600 operates by passing clk-in through flip-flops 887 and 888 (which together form a synchronizer), each of which is clocked by mclk[0]. The synchronized version of clk-in is used as a clock input to register 685, and the output of concatenator 680 is stored in register 685 at a rising edge of the synchronized version. Clk-dig-tdc (681) is derived from, and synchronous with respect to, mclk[0] (616), and represents the clock based on which digital core 150 operates. The output of register 685 is stored in register 686 at an active edge of clk-dig-tdc (681). The output of register 686 is the final 36-bit count (count[35:0] (689) generated by count logic 600. Count 689 may be processed by a digital core such as 150 of FIG. 4 to generate digital values representing time relationships between events in clk-in, or events in clk-in and another input signal or signals. The combination of components/blocks 605, 610, 615, 620 and 626 may also be viewed as a counter of block 600.

When metastability noted above is not of concern, the outputs of encoder 655, component 610 and component 620 may be concatenated to form count 689. In such an embodiment, registers 615, 625, 661 and 662, and MUX 660 and 670 may not be implemented.

TDC 100 implemented as described above can be incorporated in a larger device or system as described briefly next.

5. System

Figure 10:
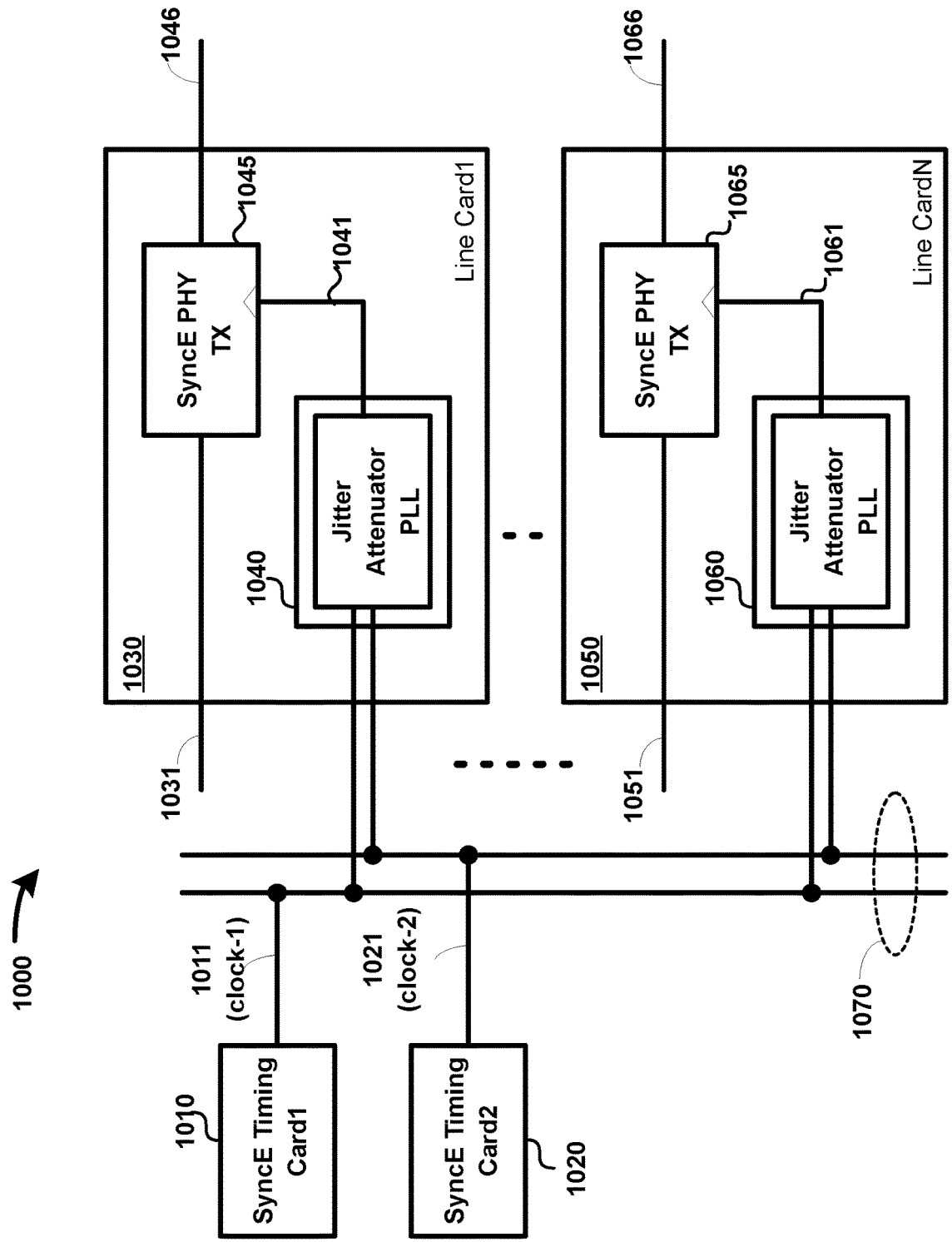
FIG. 10 is a block diagram of a system in which a device implemented according to several aspects of the present disclosure can be incorporated, in an embodiment of the present disclosure.

FIG. 10 is a block diagram of an example system containing a PLL incorporating a TDC with counters and count logic implemented according to various aspects of the present disclosure, as described in detail above. System 1000 is shown containing SyncE (Synchronous Ethernet) timing cards (1010 and 1020) and line cards 1 through N, of which only two line cards 1030 and 1050 are shown for simplicity. Line card 1030 is shown containing jitter attenuator PLL 1040 and SyncE PHY Transmitter 1045. Line card 1050 is shown containing jitter attenuator PLL 1060 and SyncE PHY Transmitter 1065. The components of FIG. 10 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 1010 or 1020). Accordingly, Ethernet packets are re-timed with respect to the master clock, and then transmitted in the physical layer. Thus, data packets (e.g., on path 1031 and 1132) are re-timed and transmitted without any time stamp information being recorded in the data packet. The packets may be generated by corresponding applications such as IPTV (Internet Protocol Television), VoIP (Voice over Internet Protocol), etc.

Thus, line card 1030 receives a packet on path 1031, and forwards the packet on output 1046 after the packet has been re-timed (synchronized) with a master clock. Similarly, line card 1050 receives a packet on path 1051, and forwards the packet on output 1066 after the packet has been re-timed (synchronized) with a master clock.

The master clock (1011/clock 1) is generated by timing card 1010. Timing card 1020 generates a redundant clock (1021/clock-2) that is to be used by line cards 1030 and 1050 upon failure of master clock 1011. Master clock 1011 and redundant clock 1021 are provided via a backplane (represented by numeral 1070) to each of lines cards 1030 and 1050.

In line card 1030, jitter attenuator PLL 1040 contains a TDC (such as TDC 400 containing a count logic implemented as described in detail above, but not shown in FIG. 10), the TDC being used for detecting phase difference between its input clocks, and receives clocks 1011 and 1021. PLL 1040 generates an output clock 1041 which is used to synchronize (re-time) packets received on path 1031 and forwarded as re-timed packets on path 1046.

Similarly, in line card 1050, jitter attenuator PLL 1060 contains a TDC (such as TDC 400 containing a count logic implemented as described in detail above, but not shown in FIG. 10) for detecting phase difference between its input clocks, and receives clocks 1011 and 1021. PLL 1060 generates an output clock 1061 which is used to synchronize (re-time) packets received on path 1051 and forwarded as re-timed packets on path 1066.

6. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4, 5, 6 and 10, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A time-to-digital converter (TDC) comprising:
a counter to generate a sequence of counts representing a number of transitions of interest of a first clock signal, said counter comprising a first sub-counter and a second sub-counter, said first sub-counter comprising a first set of flip-flops and said second sub-counter comprising a second set of flip-flops,
wherein said first set of flip-flops are coupled in a first series with an output of each flip-flop in said first series being coupled to a clock input of immediately next flip-flop in said first series to together operate as an asynchronous circuit,
wherein transitions of said second set of flip-flops are driven by a common clock to together operate as a synchronous circuit, wherein said second set of flip-flops are coupled in a second series, with an output of each flip-flop in said second series being coupled to a data input of immediately next flip-flop in said second series,
wherein said first set of flip-flops and said second set of flip-flops respectively generate a first set of bits and a second set of bits of each of said sequence of counts; and
a digital core to process a pair of counts of said sequence.

2. A time-to-digital converter (TDC) comprising:
a counter to generate a sequence of counts representing a number of transitions of interest of a first clock signal, said counter comprising an asynchronous circuit and a synchronous circuit to respectively generate a first set of bits and a second set of bits of each of said sequence of counts; and
a digital core to process a pair of counts of said sequence,
wherein said first set of bits represent more significant bits of each count compared to said second set of bits.

3. The TDC of claim 2, wherein a first count of said pair represents a first event on a first input signal, and a second count of said pair represents a second event on a second input signal,
wherein said digital core processes said pair of counts to determine a time difference between occurrences of said first event and said second event.

4. The TDC of claim 2, wherein a first count of said pair represents a first event on a first input signal, and a second count of said pair represents a second event on said first input signal,
wherein said digital core processes said pair of counts to determine a time difference between occurrences of said first event and said second event.

5. The TDC of claim 3, wherein said counter comprises a fine counter and a coarse counter,
wherein said asynchronous circuit and said synchronous circuit are comprised in said coarse counter.

6. The TDC of claim 5, further comprising a latch-logic to receive each of said first input signal and said second input signal,
said latch-logic to store said first count upon occurrence of said first event, and to forward said first count to said digital core,
said latch-logic to store said second count upon occurrence of said second event, and to forward said second count to said digital core.

7. The TDC of claim 6, wherein said fine counter comprises:
a delay chain to generate a third set of bits, wherein each bit in said third set of bits represents a corresponding one of a plurality of phases of said first clock signal; and
a first encoder to encode said third set of bits to generate a fourth set of bits.

8. The TDC of claim 7, wherein said synchronous circuit is designed to increment a first coarse output at a first type of edge of one of said plurality of phases of said first clock signal,
wherein said asynchronous circuit is designed to increment a second coarse output at a first type of edge of a most significant bit of said first coarse output,
wherein said coarse counter further comprises:
a first register to store, as a first replica coarse output, said first coarse output at a second type of edge of said one of said plurality of phases of said first clock signal; and
a second register to store, as a second replica coarse output, said second coarse output at a second type of edge of said most significant bit of said first coarse output.

9. The TDC of claim 8, wherein said first event is a rising edge of said first input signal, wherein said latch-logic comprises:
a third register to store said third set of bits at said rising edge of said first input signal, wherein said first encoder is coupled to receive said third set of bits from an output of said third register to generate said fourth set of bits;
a fourth register to store said first coarse output at said rising edge of said first input signal;
a fifth register to store said first replica coarse output at said rising edge of said first input signal;
a first multiplexer (MUX) to forward, as a first MUX output, one of a stored first coarse output and a stored first replica coarse output based on a value of a most significant bit of said fourth set of bits; and
a second encoder to encode said first MUX output to generate a fifth set of bits.

10. The TDC of claim 9, wherein said latch-logic further comprises:
a second MUX to forward, as a sixth set of bits, one of said second coarse output and said second replica coarse output based on a value of a most significant bit of said fifth set of bits; and
a concatenator to concatenate said fourth set of bits, said fifth set of bits and said sixth set of bits to generate a seventh set of bits, wherein said fourth set of bits, said fifth set of bits and said sixth set of bits are respectively a least significant portion, a middle portion and a most significant portion of said seventh set of bits;
a synchronizer to synchronize said first input signal with respect to said one of said plurality of phases of said first clock signal to generate a synchronized first input signal;
a sixth register to store said seventh set of bits at a rising edge of said synchronized first input signal to generate an eighth set of bits; and
a seventh register to store said eighth set of bits at an active edge of a clock of said digital core to generate a ninth set of bits, wherein said ninth set of bits comprises said first count.

11. A system comprising:
a line card coupled to receive a data packet, said line card to re-time said data packet with reference to a selected clock, and to transmit a re-timed packet;
a first timing card to generate a first clock; and
wherein said line card comprises a phase-locked loop (PLL) coupled to receive said first clock, said PLL to provide an output clock based on said first clock as said selected clock, wherein said PLL comprises a time-to-digital converter (TDC) operated as a phase detector, wherein said TDC comprises:
 a counter to generate a sequence of counts representing a number of transitions of interest of a first clock signal, said counter comprising an asynchronous circuit and a synchronous circuit to respectively generate a first set of bits and a second set of bits of each of said sequence of counts; and
 a digital core to process a pair of counts of said sequence,
 wherein said first set of bits represent more significant bits of each count compared to said second set of bits.

12. The system of claim 11, wherein a first count of said pair represents a first event on a first input signal, and a second count of said pair represents a second event on a second input signal,
 wherein said digital core processes said pair of counts to determine a time difference between occurrences of said first event and said second event.

13. The system of claim 11, wherein a first count of said pair represents a first event on a first input signal, and a second count of said pair represents a second event on said first input signal,
 wherein said digital core processes said pair of counts to determine a time difference between occurrences of said first event and said second event.

14. The system of claim 12, wherein said counter comprises a fine counter and a coarse counter,
 wherein said asynchronous circuit and said synchronous circuit are comprised in said coarse counter.

15. The system of claim 14, wherein said TDC further comprises a latch-logic to receive each of said first input signal and said second input signal,
 said latch-logic to store said first count upon occurrence of said first event, and to forward said first count to said digital core,
 said latch-logic to store said second count upon occurrence of said second event, and to forward said second count to said digital core.

16. The system of claim 15, wherein said fine counter comprises:
 a delay chain to generate a third set of bits, wherein each bit in said third set of bits represents a corresponding one of a plurality of phases of said first clock signal; and
 a first encoder to encode said third set of bits to generate a fourth set of bits.

17. The system of claim 16, wherein said synchronous circuit is designed to increment a first coarse output at a first type of edge of one of said plurality of phases of said first clock signal,
 wherein said asynchronous circuit is designed to increment a second coarse output at a first type of edge of a most significant bit of said first coarse output,
 wherein said coarse counter further comprises:
 a first register to store, as a first replica coarse output, said first coarse output at a second type of edge of said one of said plurality of phases of said first clock signal; and
 a second register to store, as a second replica coarse output, said second coarse output at a second type of edge of said most significant bit of said first coarse output.

18. The system of claim 17, wherein said first event is a rising edge of said first input signal, wherein said latch-logic comprises:
 a third register to store said third set of bits at said rising edge of said first input signal, wherein said first encoder is coupled to receive said third set of bits from an output of said third register to generate said fourth set of bits;
 a fourth register to store said first coarse output at said rising edge of said first input signal;
 a fifth register to store said first replica coarse output at said rising edge of said first input signal;
 a first multiplexer (MUX) to forward, as a first MUX output, one of a stored first coarse output and a stored first replica coarse output based on a value of a most significant bit of said fourth set of bits; and
 a second encoder to encode said first MUX output to generate a fifth set of bits.

19. The system of claim 18, wherein said latch-logic further comprises:
 a second MUX to forward, as a sixth set of bits, one of said second coarse output and said second replica coarse output based on a value of a most significant bit of said fifth set of bits; and
 a concatenator to concatenate said fourth set of bits, said fifth set of bits and said sixth set of bits to generate a seventh set of bits, wherein said fourth set of bits, said fifth set of bits and said sixth set of bits are respectively a least significant portion, a middle portion and a most significant portion of said seventh set of bits;
 a synchronizer to synchronize said first input signal with respect to said one of said plurality of phases of said first clock signal to generate a synchronized first input signal;
 a sixth register to store said seventh set of bits at a rising edge of said synchronized first input signal to generate an eighth set of bits; and
 a seventh register to store said eighth set of bits at an active edge of a clock of said digital core to generate a ninth set of bits,
 wherein said ninth set of bits comprises said first count.

20. The TDC of claim 1, further comprising a delay chain to generate a least significant set of bits of each of said sequence of counts, wherein each bit in said least significant set of bits represents a corresponding one of a plurality of phases of said first clock signal,
 wherein said least significant set of bits, said second set of bits and said first set of bits together represent a value of a count in said sequence of counts, said first set of bits and said second set of bits respectively correspond to the most significant bits and intermediate significant bits of each of said sequence of counts.

* * * * *